(12) United States Patent
Chiang et al.

(10) Patent No.: US 9,299,862 B2
(45) Date of Patent: Mar. 29, 2016

(54) DEVICE PACKAGING METHOD AND DEVICE PACKAGE STRUCTURE

(71) Applicant: Challentech International Corporation, Zhubei (TW)

(72) Inventors: Chung-I Chiang, Zhongli (TW); Yun-Kuei Chiu, New Taipei (TW)

(73) Assignee: Challentech International Corporation, Zhubei (TW)

( * ) Notice: Subject to any disclaimer, the term of this patent is extended or adjusted under 35 U.S.C. 154(b) by 0 days.

(21) Appl. No.: 14/282,559

(22) Filed: May 20, 2014

(65) Prior Publication Data

US 2015/0243799 A1  Aug. 27, 2015

(30) Foreign Application Priority Data

Feb. 27, 2014  (TW) .............................. 103106718 A

(51) Int. Cl.
*H01L 31/0203* (2014.01)
*H01L 31/09* (2006.01)

(52) U.S. Cl.
CPC ............. *H01L 31/0203* (2013.01); *H01L 31/09* (2013.01)

(58) Field of Classification Search
CPC .......... G01J 5/045; G01J 5/029; H01L 23/26; H01L 21/3221; H01L 23/10; H01L 2924/3025; H01L 2924/10253; H01L 2224/48091; H01L 2224/73265; H01L 2224/48227; H01L 2924/15192; H01L 2224/32225; H01L 2924/19107; H01L 2924/01079; H01L 2924/09701
See application file for complete search history.

(56) References Cited

U.S. PATENT DOCUMENTS

| | | | | |
|---|---|---|---|---|
| 2011/0050045 | A1* | 3/2011 | Aratake | H03H 9/1021 310/344 |
| 2011/0115056 | A1* | 5/2011 | Baillin | B81B 7/0038 257/617 |
| 2012/0106085 | A1* | 5/2012 | Yamazaki | G01J 5/029 361/705 |
| 2014/0087099 | A1* | 3/2014 | Veerasamy | E06B 3/6775 428/34 |

* cited by examiner

*Primary Examiner* — Jessica Stultz
*Assistant Examiner* — Mohammed R Alam
(74) *Attorney, Agent, or Firm* — Wang Law Firm, Inc.

(57) ABSTRACT

A device package method and structure thereof. The method includes steps of: providing a base and a cover, and placing a sensing device on the bottom of cavity base; placing sealant between the cover and edge part of the base, and then covering the cover on the base; irradiating a laser on the edge part for melting the sealant, so as to bond the cover and edge part; and enabling the sealed space formed between the cover and the cavity base to be in vacuum. Therefore, sensing element with high sensitivity can be packaged and manufactured efficiently.

13 Claims, 8 Drawing Sheets

DEVICE PACKAGING METHOD AND DEVICE PACKAGE STRUCTURE

CROSS-REFERENCE TO RELATED APPLICATION

This application claims the benefit of Taiwan Patent Application No. 103106718, filed on Feb. 27, 2014, in the Taiwan Intellectual Property Office, the disclosure of which is incorporated herein in its entirety by reference.

BACKGROUND OF THE INVENTION

1. Field of the Invention

The present disclosure is related to a device packaging method and device package structure, more particularly, to a method of using laser local heating for packaging a sensing element in vacuum to reduce out-gassing during the packaging process.

2. Description of the Related Art

At present, infrared camera have been applied in recording and storing continuous thermal images. The infrared camera comprises a thermal sensing IC which includes a sensing element array. The resistance of each of thermal sensing elements of the sensing element array is changed correspondingly upon receipt of the infrared radiation energy, and it means that resistance change of the thermal sensing element can correspond to strength of thermal energy, so that the thermal sensing element array can generate a thermal image correspondingly to the infrared radiation energy.

To prevent the thermal sensing element array from being affected by heat convection generated in the packaged space, the thermal sensing IC is placed on a base and packaged by a cover and the base, and particularly the packaged space is maintained in vacuum. The sensitivity of the thermal sensing element array is related to vacuum degree of the packaged space.

Please refer to FIG. 1 which illustrates a schematic view of a packaging method in the prior art. In FIG. 1, a sensing element 30 is placed on the bottom of a cavity base 10, and a sealant 90 is disposed between a cover 20 and an edge part of the cavity base 10. In the prior art, the cavity base 10 is heated from the bottom during packaging, and heat is then conducted to the edge part of the cavity base 10 for heating and melting the sealant, so that the cavity base 10 and the cover 20 are bonded to complete packaging.

However, there are some drawbacks in packaging method in the prior art. First, it is easy to damage the sensing element 30 while the bottom of the cavity base 10 is heated continuously, and may cause drop of yield rate. Second, gas is generated easily during heating under the cavity base 10, so the time for exhausting gas must be extended in order to maintain vacuum degree in the packaged space, however, which resulting in undesired longer packaging time. Thirdly, mass out-gassing may occur during heating on whole cavity base 10, which resulting in an undesired longer time for vacuumization. Moreover, longer heating time may cause the sensing element 30 being damaged more easily.

Besides, if the packaging process includes sealing of multiple elements or multiple positions, sealants or solders having different melting points must be used because of integral heating used in the packaging method in the prior art. For consideration to such packaging process using integral heating, the solder having high melting point must be used previous to the solder having low melting point. Such consideration limits the selection for sealant or solder, which resulting in increase of packaging cost.

Moreover, for kind of sensing element such as infrared thermography imager, the sensing sensitivity is in proportion to vacuum degree of packaging. Please refer to FIG. 11 which is a relationship diagram of noise equivalent temperature difference (NETD) and packaging vacuum degree of an infrared thermography imager. In FIG. 11, lower packaging vacuum degree that means higher atmospheric pressure in vacuum, causes higher noise equivalent temperature difference, it indicates that the sensitivity of the infrared thermography imager becomes lower. However, in the prior art, in order to obtain higher packaging vacuum degree, the time required for exhausting gas must be longer, so the packaging time must be extended.

SUMMARY OF THE INVENTION

To solve drawbacks in the prior art, aspect of embodiments of the present disclosure directs to a device packaging method and device package structure, to improve the sensitivity of the packaged sensing element.

An aspect of embodiments of the present disclosure directs to a device packaging method and device package structure, to improve the vacuum degree of the packaged space efficiently.

An aspect of embodiments of the present disclosure directs to use laser for local heating, so as to prevent the sensing element from being damaged during packaging process, and maintain vacuum degree of the sealed space.

An aspect of embodiments of the present disclosure directs to use laser for local heating, so as to reduce out-gassing and residual stress generated during packaging process efficiently.

An aspect of embodiments of the present disclosure directs to complete laser packaging and vacuum hole sealing simultaneously, so as to improve efficiency of packaging.

An aspect of embodiments of the present disclosure directs to use getter for improving the vacuum degree of the sealed space.

An exemplary embodiment of the present disclosure provides a device packaging method which comprises following steps. First, a cavity base and a cover are provided, and a sensing device is placed on bottom of the cavity base. A sealant is placed between the cover and an edge part of the cavity base, and then the cover is covered on the base. Next, a laser is irradiated on the edge part for melting the sealant to bond the cover and edge part. The sealed space between the cover and the cavity base is formed in vacuum.

Preferably, the sensing element may be a temperature sensor or an infrared thermography imager.

Preferably, the device packaging method according to the present disclosure further comprises a step of performing packaging in vacuum chamber.

Preferably, the cavity base is formed by ceramic material or semiconductor material.

Preferably, the cover may be formed by transparent material or glass material.

Preferably, the sealant may be metal alloy material.

Preferably, the device packaging method according to the present disclosure further comprises a step of disposing a first adhesive layer on the cover and a second adhesive layer on the edge part. When being irradiated by laser to heat, the sealant, the first adhesive layer and the second adhesive layer are melted to fuse together.

Preferably, the device packaging method according to the present disclosure further comprises a step of irradiating laser on the cover to heat the sealant indirectly.

Preferably, the device packaging method according to the present disclosure further comprises a step of irradiating laser on the sealant directly through the cover to melt the sealant.

Preferably, the cavity base further comprises at least one vacuum hole configured for exhausting gas within the sealed space to form vacuum.

Preferably, the vacuum hole is disposed on a path on which laser is irradiated. When the sealant is heated and melted, the vacuum hole is sealed by the melted sealant.

Preferably, an upper wall of the vacuum hole is provided with a sunken part for accommodating a solid material, and when a region near the vacuum hole is heated by the laser, the solid material is melted to seal the vacuum hole.

Preferably, the device packaging method according to the present disclosure further comprises a step of placing or coating a getter on a lower surface of the cover, or on the bottom or an inner side wall of the cavity base.

Preferably, the getter is placed on the lower surface and near the edge part of the cavity base, and when the laser is irradiated on the edge part, the getter is heated and activated to absorb gas.

Preferably, the device packaging method according to the present disclosure further comprises a step of providing a plurality of getters, and placing a part of plurality of getters near the edge part, and placing another part of the plurality of getters apart from the edge part. When the laser is irradiated on the edge part, only the getters near the edge part is heated and activated.

An exemplary embodiment of the present disclosure provides a device package structure which is adapted for laser packaging in vacuum. The device package structure comprises a sensing element, a cavity base, a cover, a sealant and a vacuum hole. The sensing element is placed on bottom of the cavity base, and the cover is covered on the cavity base. The sealant is placed between the cover and the edge part of the cavity base. The vacuum hole is disposed near the edge part, and configured for exhausting gas existing in the sealed space formed between the cover and the cavity base, to form vacuum. An upper wall of the vacuum hole is provided with a sunken part for accommodating a solid material.

Preferably, when the laser is irradiated on the edge part to heat the sealant, the solid material is melted to seal the vacuum hole.

An exemplary embodiment of the present disclosure provides a device package structure which is adapted for laser packaging in vacuum. The device package structure comprises a sensing element, a cavity base, a cover, a sealant and a getter. The sensing element is placed on bottom of the cavity base. The cover is covered on the cavity base. The sealant is placed between the cover and the edge part of the cavity base. The getter is placed or coated at a lower surface of the cover, or at bottom or inner side wall of the cavity base, and near the edge part.

Preferably, when the laser is irradiated on the edge part to heat the sealant, the getter is heated and activated to absorb gas inside the sealed space formed between the cover and the cavity base.

Preferably, a plurality of getters are provided, a part of the plurality of getters are near the edge part, and other part of the plurality of getters are apart from the edge part, and when the laser is irradiated on the edge part, only the getter near the edge part is heated and activated.

BRIEF DESCRIPTION OF THE DRAWINGS

The detailed structure, operating principle and effects of the present invention will now be described in more details hereinafter with reference to the accompanying drawings that show various embodiments of the invention as follows.

DETAILED DESCRIPTION OF THE PREFERRED EMBODIMENTS

Figure 1:
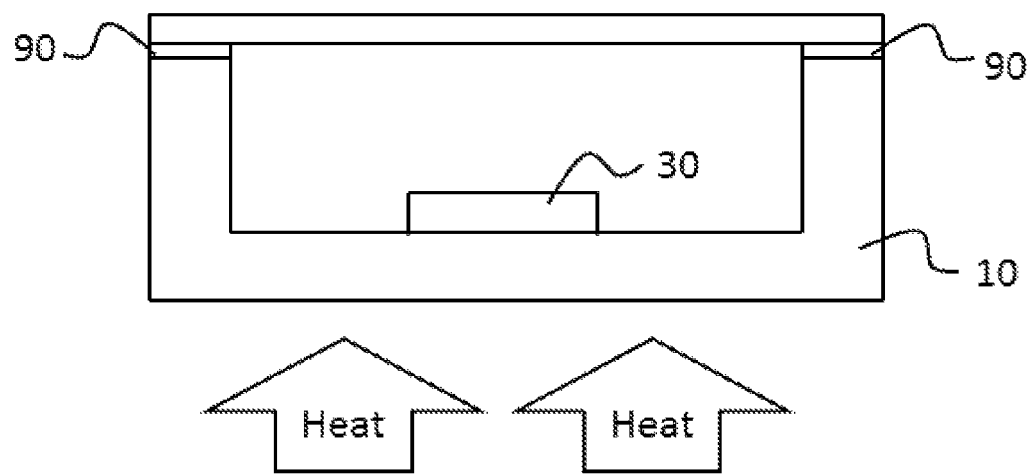
FIG. 1 is a schematic view of a packaging method in the prior art.

Reference will now be made in detail to the exemplary embodiments of the present disclosure, examples of which are illustrated in the accompanying drawings.

Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component. Thus, a first element discussed below could be termed a second element without departing from the teachings of embodiments. As used herein, the term "or" includes any and all combinations of one or more of the associated listed items.

Figure 2:
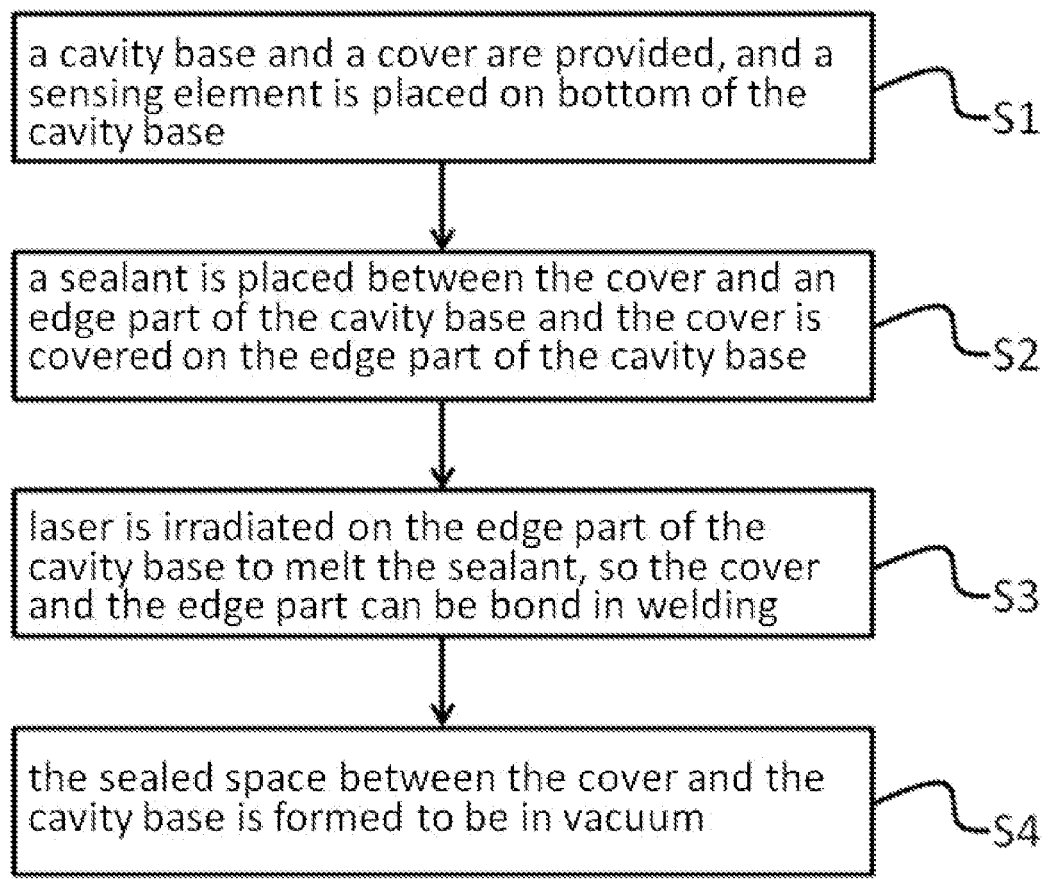
FIG. 2 is a flow diagram of a device packaging method according to the present disclosure.
Figure 3:
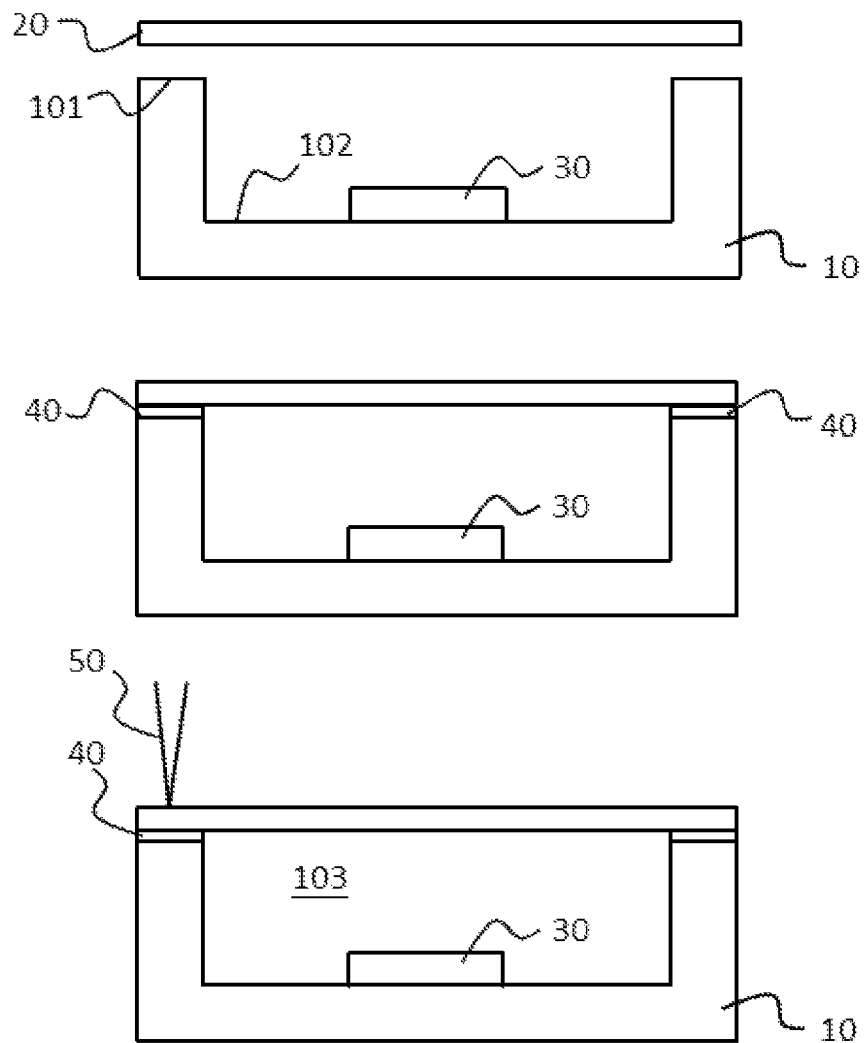
FIG. 3 is a schematic view of a first embodiment of the device packaging method according to the present disclosure.

FIG. 2 is a flow of a device packaging method according to the present disclosure, and FIG. 3 is a schematic view of a first embodiment of the device packaging method according to the present disclosure. It is noted that the illustration for steps shown in the FIG. 2 corresponds to the schematic view shown in FIG. 3.

Please refer to the FIG. 2, the device packaging method according to the present disclosure comprises following steps. In step S1, a cavity base 10 and a cover 20 are provided, and a sensing element 30 is placed on bottom of the cavity base 10, as shown in portion (A) of the FIG. 3. In implementation, the cavity base 10 and the cover 20 may be formed by heterogeneous materials. For example, the cavity base 10 can be formed by ceramic material or semiconductor material, and the cover 20 can be formed by transparent material or glass material; however, the present disclosure is not limited thereto. The cavity base 10 and the cover 20 also can be formed by the same material if necessary. Besides, the transparent material may comprise the material capable of transmitting visible light or infrared light, and the transparent material transmitting light with specific wavelength can be selected to form the cover 20 according to usage demand. Preferably, the sensing element 30 may be a temperature sensor or an infrared thermography imager.

Next, in step S2, a sealant 40 is placed between the cover 20 and an edge part 101 of the cavity base 10 and then the cover 20 is covered on the edge part 101 of the cavity base 10, as shown in portion (B) of the FIG. 3. In embodiments, the sealant 40 is coated or placed on the edge part 101 in advance; alternatively, the sealant 40 can be coated or placed on a region of the cover 20 corresponding to the edge part 101. Next, the cover 20 is covered on the cavity base 10. When the cavity base 10 is formed by ceramic material and the cover 20 is formed by glass material, the sealant 40 can be metal alloy material or solder material, such as Ge/Al alloy, AuSn solder material, SnSb solder material, SnAgCu solder material, SnIn solder material or combination of multiple alloy/solder materials; however, the present disclosure is not limited thereto. Any material capable of sealing the cover 20 and the cavity base 10 can be the sealant 40. Alternatively, when the cavity base 10 and the cover 20 are formed by the same material, the sealant 40 also can be the material similar to the cavity base 10 or the cover 20.

In step S3, a laser 50 is irradiated on the edge part 101 of the cavity base 10 to melt the sealant 40, so that the cover 20 and the edge part 101 can be bonded in welding, as shown in portion (C) of the FIG. 3. Next, in step S4, the sealed space 103 between the cover 20 and the cavity base 10 is formed to be in vacuum. In FIG. 3, the packaging process is performed in a vacuum chamber, therefore, the sealed space 103 is in vacuum naturally after packaging is completed, but the present disclosure is not limited thereto. Other embodiments about how to form the sealed space 103 in vacuum will be described in detail in below paragraph.

If necessary, the device packaging method according to the present disclosure can further comprise a step of placing or coating a getter on a lower surface of the cover 20, or placing or coating a getter on bottom or inner side wall of the cavity base 10. In implementation, the getter may be placed on the lower surface of the cover 20 and near the edge part 101 of the cavity base 10. Therefore, when the laser 50 is irradiated on the edge part 101, the getter can be heated and activated to absorb gas to improve the vacuum degree of the sealed space 103.

Besides, in the step S3, the laser 50 can heat the sealant 40 directly or indirectly upon demand. For heating indirectly, the laser 50 is focused on the cover 20 and irradiates the cover 20 for heating, and the heat is conducted to the sealant 40 gradually, so the sealant 40 is heated to melt indirectly. For heating directly, the laser 50 is irradiated by a specific frequency corresponding to the sealant 40 and passed through the cover 20 to focus on the sealant 40 directly, so that the sealant 40 absorbs heat to be melted, and the cover 20 and the cavity base 10 are bonded by the melted sealant 40. However, said ways of bonding described in this embodiment are taken as example, and the present disclosure is not limited thereto. In implementation, polymer adhesive bonding, diffusion bonding, or other bonding way can be applied in this device packaging method.

Figure 4:
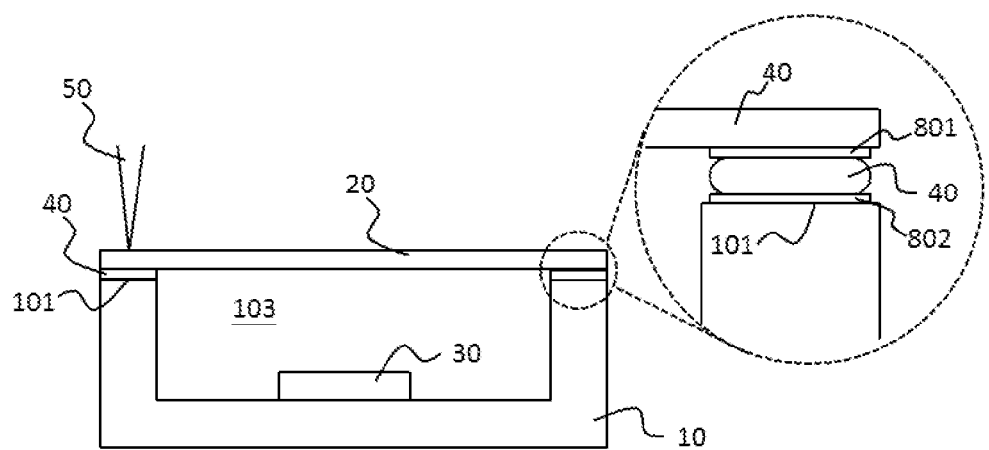
FIG. 4 is a schematic view of a second embodiment of the device packaging method according to the present disclosure.

Please refer to FIG. 4 which is a schematic view of a second embodiment of the device packaging method according to the present disclosure. The difference between the second embodiment and the first embodiment is that a first adhesive layer 801 and a second adhesive layer 802 are disposed on the cover 20 and the edge part 101, respectively. When being irradiated by laser 50 to heat, the sealant 40, the first adhesive layer 801 and the second adhesive layer 802 are melted to fuse together, so that seal strength can be improved. In implementation, the first adhesive layer 801 or the second adhesive layer 802 can be metal alloy material, such as Ge/Al alloy, AuSn solder material, SnSb solder material, SnAgCu solder material or SnIn solder material.

Figure 5:
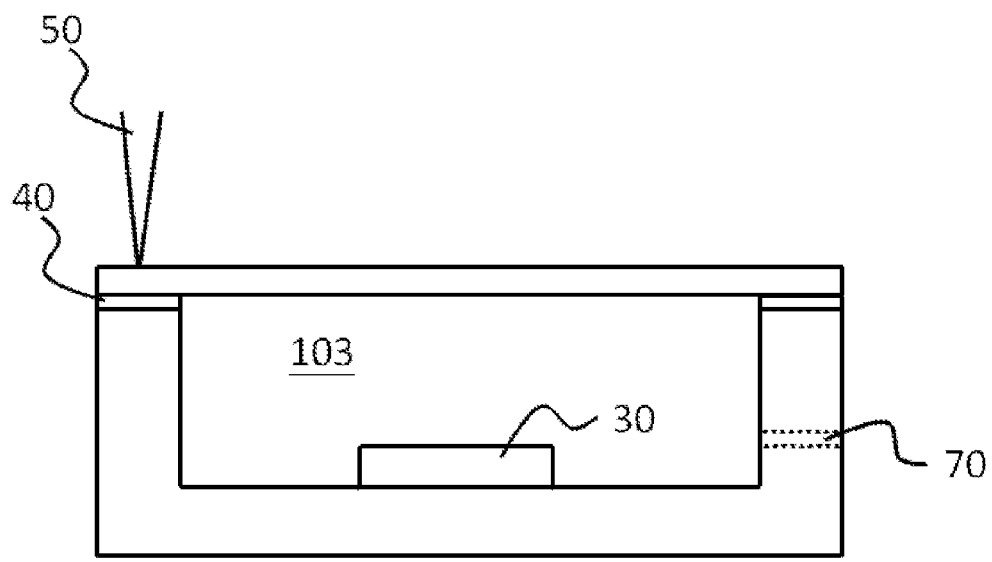
FIG. 5 is a schematic view of a third embodiment of the device packaging method according to the present disclosure.

Please refer to FIG. 5 which is a schematic view of a third embodiment of the device packaging method according to the present disclosure. The difference between the third embodiment and above-mentioned two embodiments is that the cavity base 10 further comprises at least one vacuum hole 70 configured for exhausting gas existing in the sealed space 103 to enable the sealed space 103 to be in vacuum. When the vacuum degree of the sealed space 103 reaches a preset value, such as about 10-6 torr, the vacuum hole 70 is sealed to maintain the sealed space 103 in desired vacuum degree. Compared with the first embodiment, the third embodiment is implemented by using gas exhausting apparatus without vacuum chamber, so manufacturing cost can be reduced. The first embodiment is implemented in vacuum chamber, which resulting in higher manufacturing cost. However, the first embodiment may be more efficient than the third embodiment due to without the process of sealing the vacuum hole 70.

The beam width of the laser 50 is much narrower than the width of the cavity base 10, the sensing element 30 placed at the central position of the cavity base 10 is not damaged during laser local heating.

Figure 6:
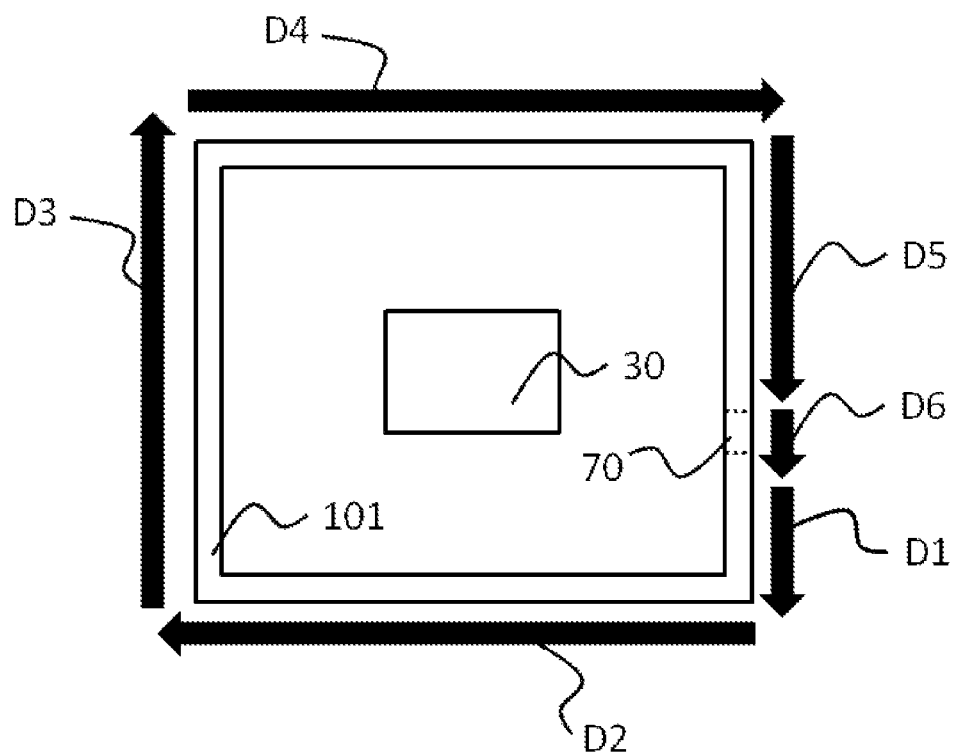
FIG. 6 is a schematic view of a fourth embodiment of the device packaging method according to the present disclosure.
Figure 7:
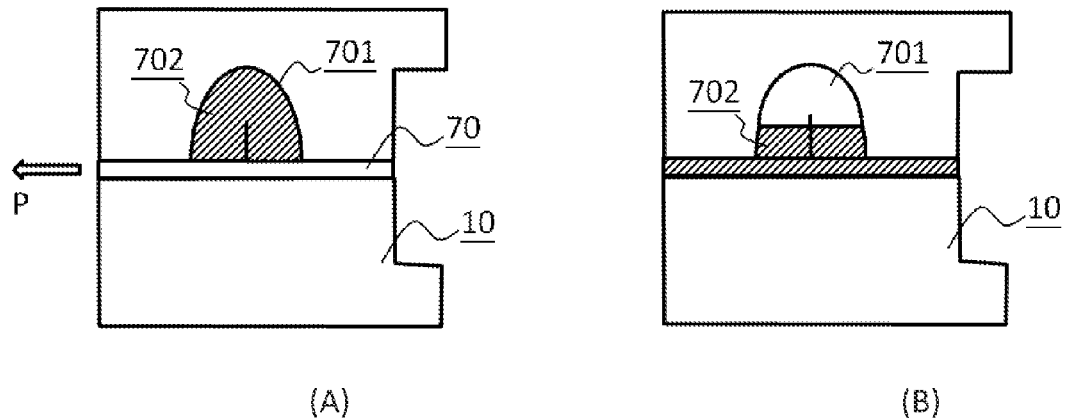
FIG. 7 is a schematic view of an embodiment of the device package structure according to the present disclosure.

Please refer to FIG. band FIG. 7 which are schematic views of a fourth embodiment of the device packaging method according to the present disclosure and a device package structure according to the present disclosure, respectively. The fourth embodiment is substantially similar to the above-mentioned embodiments, but the different feature of the fourthly embodiment is that the vacuum hole 70 is disposed on the path D1~D6 on which laser 50 is irradiated. When the sealant 40 is melted by the laser 50, as shown in FIG. 6, the laser 50 starts to irradiate along the path D1, it also starts to exhaust the gas within the sealed space 103 on the exhaust direction P.

When the laser 50 is irradiated on the path D6 and the gas is exhausted enough to enable the sealed space 103 to be in desired vacuum degree, irradiation of the laser 50 on the path D6 seals the vacuum hole 70 simultaneously. In implementation, the vacuum hole 70 may be disposed near the sealant 40, so that when the sealant 40 is heated to melt, the melted sealant 40 or melted material of the base can seal the vacuum hole 70.

Alternatively, as shown in portion (A) of the FIG. 7, the vacuum hole 70 of the device package structure is disposed near the edge part 101, and particularly, an upper wall of the vacuum hole 70 is provided with a sunken part 701, and a solid material 702 is accommodated in the sunken part 701. When the sealant 40 is heated to melt, the solid material 702 is also heated and the melted solid material 702 flows into the vacuum hole 70. After the melted solid material 702 solidifies, the vacuum hole 70 is sealed, as shown in portion (B) of the FIG. 7.

Extra process of sealing the vacuum hole 70 is not necessary in the fourth embodiment, so the fourth embodiment has advantage of simplifying packaging process. The irradiation speed of laser 50 can match with the exhaust speed, so the laser 50 is not irradiated on the edge part 101 where the vacuum hole 70 is disposed until the vacuum degree of the sealed space 103 reaches the desired value. Therefore, sealing between the cover 20 and the cavity base 10 and sealing of the vacuum hole 70 can be completed together.

Figure 8:
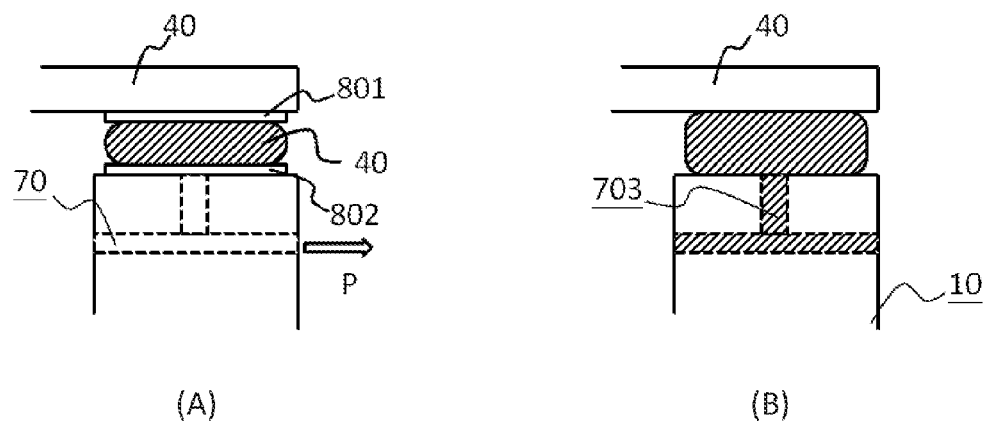
FIG. 8 is a schematic view of another embodiment of the device package structure according to the present disclosure.

Please refer to FIG. 8 which is a schematic view of another embodiment of the device package structure according to the present disclosure. The difference between this embodiment and the embodiment shown in FIG. 7 is that the vacuum hole 70 is near the edge part 101 and a through hole 703 is provided between the edge part 101 and the vacuum hole 70, as shown in portion (A) of the FIG. 8. When the laser 50 heats the sealant 40 to melt, the melted sealant 40 can flows into the vacuum hole 70 via the through hole 703. After the melted solid material 702 solidifies, the vacuum hole 70 is sealed, as shown in portion (B) of the FIG. 8. Therefore, the sealing of the cover 20 and the cavity base 10 and sealing of the vacuum hole 70 can be completed together.

Figure 9:
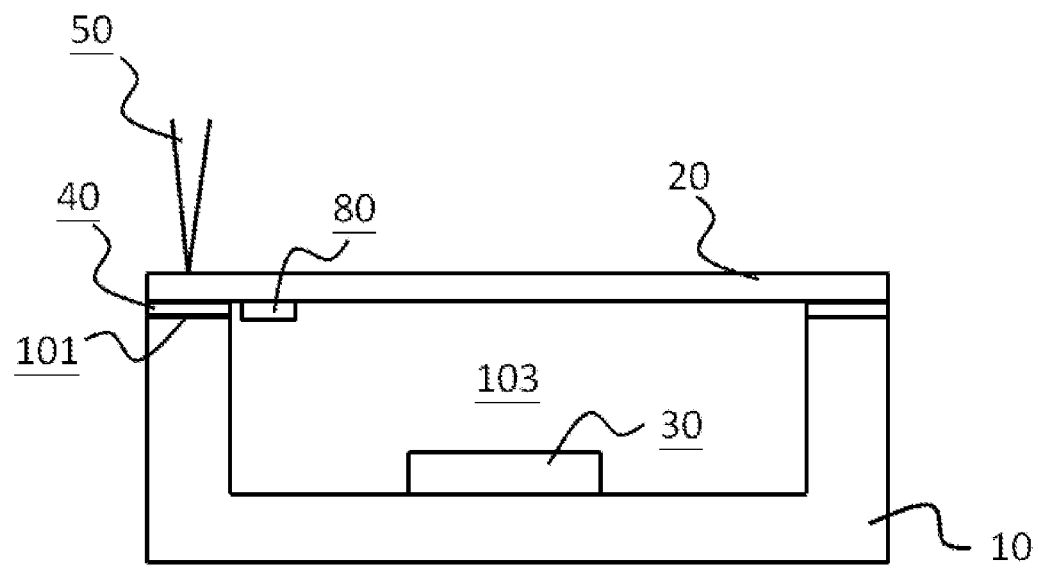
FIG. 9 is a schematic view of another embodiment of the device package structure according to the present disclosure.

Please refer to FIG. 9 which is a schematic view of another embodiment of a device package structure according to the present disclosure. In FIG. 9, the difference between the device package structure of this embodiment and the above-mentioned embodiments is that a getter 80 is provided on a lower surface of the cover 20 and near the edge part 101. In FIG. 9, the way of placing the getter 80 is an example, but it is not limited thereto. Except for being individually placed or being coated, the getter 80 also can be filmed on the lower surface of the cover 20.

When the laser 50 is irradiated on the edge part 101 to heat the sealant 40, the getter 80 close to the sealant 40 is also heated and activated to absorb gas, therefore the vacuum degree of the sealed space 103 formed between the cover 20 and the cavity base 10 is enhanced.

Figure 10:
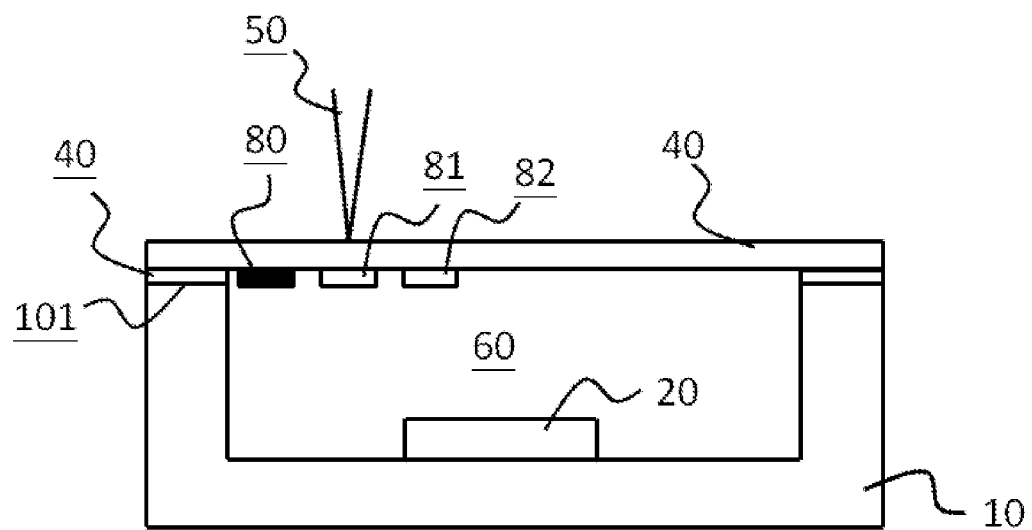
FIG. 10 is a schematic view of another embodiment of the device package structure according to the present disclosure.
Figure 11:
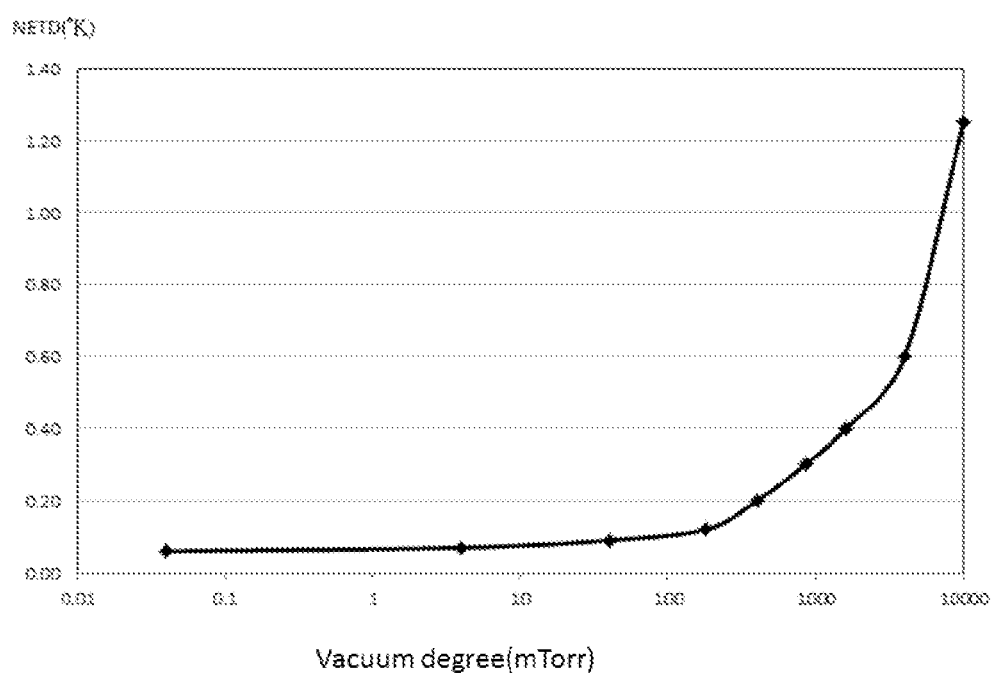
FIG. 11 is a relationship diagram of the noise equivalent temperature difference and the package vacuum degree of an infrared thermography imager.

Please refer to FIG. 10 which is a schematic view of another embodiment of a device package structure according to the present disclosure. This embodiment applies the laser local heating to extend usage life of the components. In FIG. 9, a plurality of getter 80, 81 and 82 are placed on the lower surface of the cover 20 along a direction from the edge part 101 to center of the cover 20. That is, a part of the getters is close to the edge part 101, and other part is apart from the edge part 101.

By the laser local heating, when the laser 50 is irradiated on the edge part 101 to heat the sealant 40, only the getter 80 is heated to activate but the getter 81 and 82 are not affected. In packaging process, the other getters 81 and 82 can be activated by laser 50 upon the vacuum degree in sealed space 103.

In FIG. 10, the activated getter 80 is marked in black color. After the sensing element 30 is packaged for a time period, the vacuum degree of the sealed space 103 decay possibly due to gas penetration from outside or outgassing of the cavity case 10, which resulting in deceasing of the sensitivity of the sensing element 30.

In this case, the laser 50 can be irradiated on the package to heat the getter 81, so that the getter 81 is activated correspondingly to absorb gas, and the vacuum degree of the sensing element 30 can be restored. Therefore, in order to extend usage life of the sensing element 30, the getter 81 and 82 can be activated individually after packaging is completed.

According to illustration of each of above-mentioned embodiments, compared with the traditional way of heating bottom of the cavity case 10, the device packaging method according to the present disclosure has the following advantages.

First, the present disclosure using laser local heating can shorten packaging time.

Second, the present disclosure using laser local heating can decrease the possibility of sensing element being damaged efficiently and improve the vacuum degree of the sealed space efficiently.

Thirdly, the present disclosure using laser local heating can reduce out-gassing caused in the packaging process, so the vacuum degree of the sealed space may be maintained for longer time after packaging.

Fourthly, the present disclosure using laser local heating can complete packaging of the sensing element and sealing of the vacuum hole at the same.

Fifthly, the present disclosure using laser local heating can cooperate with the getter to extend usage life of the sensing element efficiently.

Sixthly, if the packaging process includes sealing of multiple elements or multiple positions, the present disclosure using laser local heating can minimize mutual effect between weldings of multiple positions or multiple elements, therefore, the limitation of select sealant or solder can be minimized and packaging cost can be decreased efficiently.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A device packaging method, comprising:
    providing a cavity base and a cover, and placing a sensing element on bottom of the cavity base;
    placing a sealant between the cover and an edge part of the cavity base, and then covering the cover on the cavity base;
    providing a plurality of getters, and placing a part of the plurality of getters near the edge part, and another part of the plurality of getters apart from the edge part;
    irradiating a laser on the edge part of the cavity base to melt the sealant for bonding the cover and the edge part, when the laser is irradiated on the edge part, only the getters near the edge part are heated and activated; and
    enabling a sealed space formed between the cover and the cavity base to be in vacuum.

2. The device packaging method according to claim 1, wherein the sensing element is a temperature sensor or an infrared thermography imager.

3. The device packaging method according to claim 1, further comprising a step of performing packaging in a vacuum chamber.

4. The device packaging method according to claim 1, wherein the cavity base is formed by ceramic material or semiconductor material, and the cover is formed by transparent material or glass material.

5. The device packaging method according to claim 4, wherein the sealant is metal alloy material.

6. The device packaging method according to claim 5, further comprising:
    disposing a first adhesive layer on the cover and disposing a second adhesive layer on the edge part; and
    wherein when the laser is irradiated to heat, the sealant, the first adhesive layer and the second adhesive layer are melted to fuse together.

7. The device packaging method according to claim 1, further comprising a step of irradiating the laser on the cover to heat the sealant indirectly, or irradiating the laser on the sealant directly through the cover to melt the sealant.

8. The device packaging method according to claim 1, wherein the cavity base further comprises at least one vacuum hole configured for exhausting gas within the sealed space to form vacuum.

9. The device packaging method according to claim 8, wherein the at least one vacuum hole is disposed on a path on which the laser is irradiated, and when the sealant is heated and melted, the at least one vacuum hole is sealed by the melted sealant.

10. The device packaging method according to claim 9, wherein an upper wall of the at least one vacuum hole is provided with a sunken part, the sunken part is for accommodating a solid material, and when the laser heats a region near the at least one vacuum hole, the solid material is melted to seal the vacuum hole.

11. The device packaging method according to claim 9, wherein a through hole is provided between the at least one vacuum hole and the edge part, when the sealant is heated by the laser, the melted sealant flows to the vacuum hole via the through hole, and the vacuum hole is sealed after the melted sealant solidifies.

12. The device packaging method according to claim 1, further comprising a step of placing or coating a getter on a lower surface of the cover, or on bottom or inner side wall of the cavity base.

13. The device packaging method according to claim 12, wherein the getter is placed on the lower surface and near the edge part of the cavity base, and when the laser is irradiated on the edge part, the getter is heated and activated to absorb gas.

* * * * *

UNITED STATES PATENT AND TRADEMARK OFFICE
CERTIFICATE OF CORRECTION

| | | |
|---|---|---|
| PATENT NO. | : 9,299,862 B2 | Page 1 of 1 |
| APPLICATION NO. | : 14/282559 | |
| DATED | : March 29, 2016 | |
| INVENTOR(S) | : Chung-I Chiang et al. | |

It is certified that error appears in the above-identified patent and that said Letters Patent is hereby corrected as shown below:

ON THE TITLE PAGE

(73) Assignee should be "Chung-I Chiang" instead of "Challentech International Corporation"

Signed and Sealed this
Thirty-first Day of May, 2016

Michelle K. Lee
*Director of the United States Patent and Trademark Office*